United States Patent [19]

Barbu et al.

[11] Patent Number: 4,970,452

[45] Date of Patent: Nov. 13, 1990

[54] INTEGRATED CIRCUIT COMPRISING A SWITCHABLE CURRENT GENERATOR

[75] Inventors: Stephane Barbu; Richard Morisson, both of Caen, France

[73] Assignee: U.S. Philips Corporation, New York, N.Y.

[21] Appl. No.: 452,852

[22] Filed: Dec. 19, 1989

[30] Foreign Application Priority Data

Dec. 30, 1988 [FR] France .................................. 88 17501

[51] Int. Cl.$^5$ .............................................. G05F 3/22
[52] U.S. Cl. ...................................... 323/317; 323/315; 330/257; 330/288
[58] Field of Search ................ 323/311, 313, 314, 315, 323/316, 317, 351; 330/257, 288, 297

[56] References Cited

U.S. PATENT DOCUMENTS

| | | | |
|---|---|---|---|
| 4,458,201 | 7/1984 | Koen .................................. | 323/317 |
| 4,584,520 | 4/1986 | Vinn .................................. | 323/351 |
| 4,600,965 | 7/1986 | Sato et al. ........................ | 361/152 |
| 4,700,125 | 10/1987 | Takata et al. .................... | 323/351 |
| 4,703,250 | 10/1987 | Frappe et al. .................... | 323/351 |
| 4,714,900 | 12/1987 | Sata .................................. | 331/17 |
| 4,740,743 | 4/1988 | Reisinger et al. ................ | 323/317 |
| 4,818,901 | 4/1989 | Young et al. ..................... | 323/315 |

Primary Examiner—Peter S. Wong
Attorney, Agent, or Firm—Bernard Franzblau

[57] ABSTRACT

An integrated circuit comprising a current generator which is switchable to at least two modes. A first stage comprises a current mirror ($T_3$, $T_4$) having two branches. A differential pair second stage ($T_1$, $T_2$) is either in a balanced state (current output zero) or in an unbalanced state (current source $R_{10}$, $T_{10}$ supplying a current $I_1$). In the balanced state a second current source ($R_{20}$, $T_{20}$) supplies a current which maintains the currents in the two branches of the current mirror constant.

14 Claims, 2 Drawing Sheets

INTEGRATED CIRCUIT COMPRISING A SWITCHABLE CURRENT GENERATOR

BACKGROUND OF THE INVENTION

The present invention relates to an integrated circuit comprising a switchable current generator having at least a first or current-supply mode and a second or high-impedance mode.

Such switchable current generators (in particular those employing class-A amplifiers with an active load) are known from the prior art but have the drawback that they require at least one pnp transistor to be switched. The current sources comprise one or more pnp transistors and the current sinks comprise one or more npn transistors, which is necessary in order to guarantee accurately controlled and load-independent current sourcing and sinking. However, npn transistors in integrated circuits have substantially faster switching times.

SUMMARY OF THE INVENTION

It is an object of the invention to provide an integrated circuit comprising a switchable current generator as defined above, in which the switching function is performed solely by means of npn transistors in order to obtain a high switching speed.

To this end the circuit in accordance with the invention is characterized in that it comprises a first stage comprising a current mirror having a first and a second branch, and a second stage comprising a differential pair comprising a first and a second transistor of the npn type whose emitters are connected to each other and to a first current source supplying current of given magnitude, and whose collectors are connected respectively to said first and said second branch of the current mirror, the collector of the first transistor forming an output of the switchable current generator, in that it comprises a controllable second current source comprising a third transistor of the npn type connected to the emitters of the first and the second transistor, said second current source having a current-supply state and an inoperative state, in that it comprises a switching circuit constructed in such a manner that in the first mode the second current source is set to the inoperative state and the second stage is unbalanced so as to render the first transistor substantially non-conductive, and in the second mode the second current source is set to the current supply state and the second stage is balanced, and in that the currents of first and the second current source are substantially equal.

Thus, the only switching operations are those involving npn transistors (second current source, second stage), the fact that currents of the first and the second current source have substantially the same value enabling the current in the pnp transistors of the current mirror to be maintained substantially constant.

In an embodiment of the invention the bases of the first and the second transistor are connected to a reference voltage source via a first and a second resistor respectively, the circuit comprises a controllable npn-type third current source connected to the base of the first transistor and having a current supply state and an inoperative state, and the switching circuit comprises a means for controlling the third current source so as to set it to its current supply state in the first mode and to its inoperative state in the second mode.

The unbalance of the second stage is suitably selected in such a manner that the first transistor is not cut off completely but nevertheless effectively blocks the passage of the first current. Consequently, a very fast change from the first to the second mode is obtained.

In a further embodiment of the invention, in order to obtain a third mode, the circuit comprises a controllable npn-type fourth current source connected to the collector of the first transistor and having a current supply state and an inoperative state.

In another embodiment of the invention the switching circuit is adapted in such a manner that in the third mode the second and the fourth current source are in the current supply state and the second stage is balanced. The current of the fourth current source may be substantially equal to that of the first current source.

In a modified embodiment of the invention the switching circuit is adapted in such a manner that in the third mode the second current source is in the inoperative state, the second stage is unbalanced, and the fourth current source is in the current supply state. The current of the fourth current source may be substantially equal to twice the current of the first current source.

A controllable current source may be formed by a digital-to-analog converter comprising npn transistors and a current output.

BRIEF DESCRIPTION OF THE DRAWINGS

The invention will be more fully understood upon reading the following description with reference to FIG. 1, which shows an embodiment of the invention, and FIG. 2, which shows a modification in accordance with the invention.

DESCRIPTION OF THE PREFERRED EMBODIMENT

Figure 1:
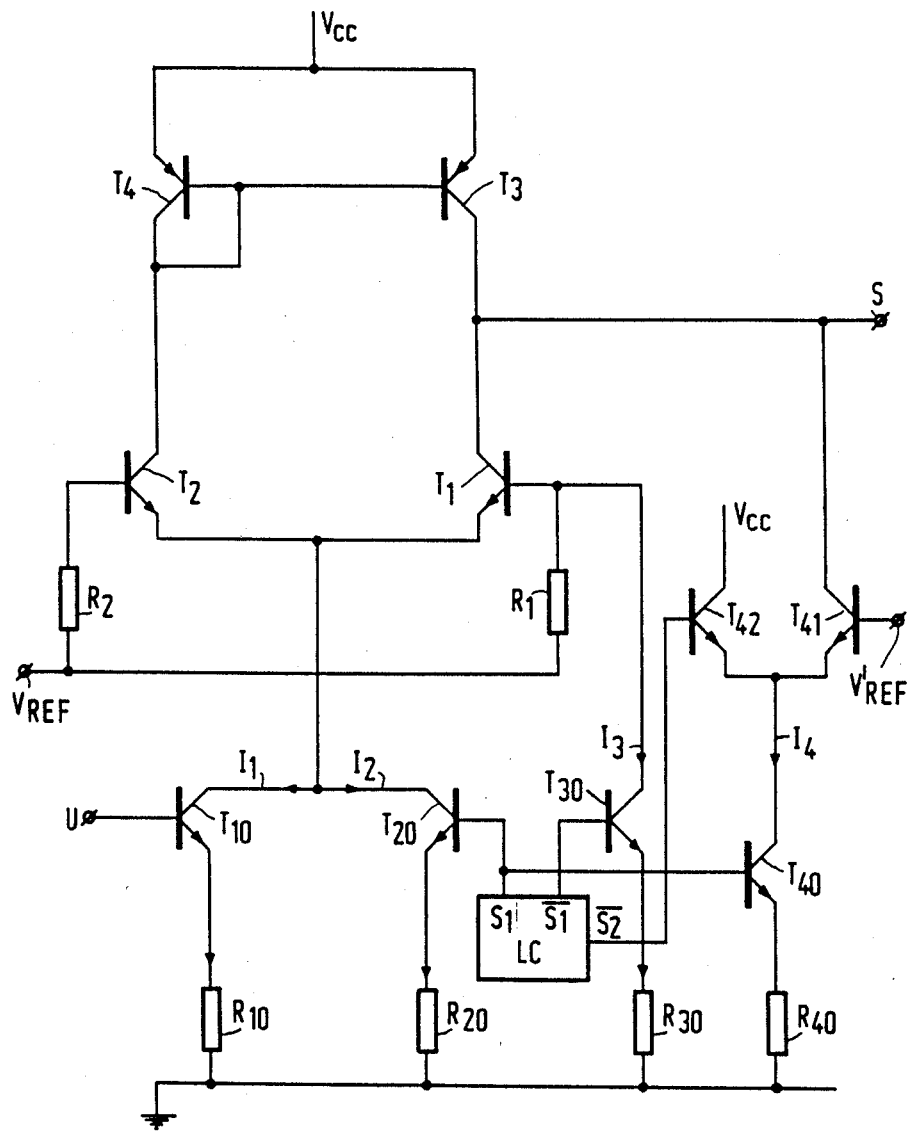

FIG. 1 shows a two-transistor current mirror of the Widlar type comprising two pnp transistors $T_3$ and $T_4$ whose emitters are connected to a supply-voltage source $V_{cc}$ and whose bases are interconnected. Moreover, the base and the collector of the transistor $T_4$ are interconnected. This results in substantially identical currents being supplied by the collectors of the transistors $T_3$ and $T_4$, so that a first stage is constituted by this current mirror having two branches. For more details on a current mirror of this type and other types reference is made to the publication "Analysis and Design of Analog Integrated Circuits" by Gray and Meyer (2nd quarter 1984, published by John WILEY AND SONS).

The currents supplied by said first stage are applied to a second stage, constituted by an npn differential pair, to effect switching. This second stage comprises two emitter-coupled transistors $T_1$ and $T_2$ whose collectors are connected to those of the transistors $T_3$ and $T_4$ respectively. The interconnected emitters of the transistors $T_1$ and $T_2$ are connected to a first current source supplying a constant current $I_1$ and comprising a transistor $T_{10}$ whose base is at a given potential U, whose collector is connected to the emitters of the transistors $T_1$ and $T_2$, and whose emitter is connected to the common-mode terminal by a resistor $R_{10}$. The bases of the transistors $T_1$ and $T_2$ are connected to a reference voltage source $V_{REF}$ via resistors $R_1$ and $R_2$ whose values are selected in such a way that the differential stage is balanced (i.e. $R_1 = R_2$ if spreads are ignored). A controllable second current source, which comprises a transistor $T_{20}$ whose collector is connected to the emitters of the transistors $T_1$ and $T_2$ and whose emitter is connected to the common-mode terminal by a resistor $R_{20}$, is controlled by a logic signal $S_1$ supplied by a logic switching circuit LC. When $S_1$ is high the second current source ($R_{20}$, $T_{20}$) is active and supplies a current $I_2$.

The differential stage ($T_1$, $T_2$) is unbalanced by means of a controllable third current source comprising an npn transistor $T_{30}$ whose emitter is connected to the common-mode terminal by a resistor $R_{30}$ and whose base is driven by the signal $\overline{S_1}$, the logic inverse of $S_1$, supplied by the logic switching circuit LC. When $S_1$ is high the current source $T_{30}$ draws a current $I_3$, which results in the base potential of the transistor $T_1$ being reduced and the transistor being gradually turned off. $R_1I_3$ is selected to be small enough (approximately 300 mV) to ensure that the current in the transistor $T_1$ is negligible without the transistor being cut off completely. In the balanced state of the differential stage the transistor $T_1$ is no longer in the saturated mode. This means that the differential stage operates substantially in its linear region, as a result of which the time required for switching between the first and the second mode is optimized. Obviously, $T_1$ may be switched between its cut-off and its saturated state, but the switching time will then be longer, although it will remain smaller than the switching time of a pnp transistor.

The circuit further operates as follows. When $S_1$ is low (first mode) no current will flow in $T_{20}$. The differential pair ($T_1$, $T_2$) is unbalanced, so that the transistor $T_1$ is in a quasi cut-off state. The current $I_1$ flows through the transistor $T_4$ and hence through the transistor $T_3$. Therefore, the output S behaves as a current source supplying a current $I_1$.

When $S_1$ is high (second mode) the current $I_2$ will flow in $T_{20}$. The differential pair ($T_1$, $T_2$) is balanced resulting in a current $(I_1+I_2)/2$. The output S does not supply any current and is in a state of high impedance. Thus, a current source supplying a current (and comprising a pnp transistor) is switched over by switching only npn transistors. When $I_2=I_1$ the current in the branches of the current mirror does not vary. Consequently, no time is needed to build up the current in the current mirror. In the absence of the second current source supplying the current $I_2$ the switching time will deteriorate owing to the time needed for the current of the current mirror to decrease to half its value, i.e. a switching time corresponding to that of pnp transistors. $I_2$ enables the transistors $T_3$ and $T_4$ to be operated with a constant current.

If a three-mode current generator is needed a controllable fourth current source of the npn type may be connected to the output S, which in a preferred embodiment can be set to the current-supply state (current $I_4$) when the generator is in the high-impedance mode ("second mode").

The fourth current source comprises a transistor $T_{40}$ whose base is driven by the signal $S_1$ and whose emitter is connected to the common-mode terminal by a resistor $R_{40}$. The collector of the transistor $T_{40}$ is connected to a differential switching circuit which is controlled by a signal $S_2$ supplied by the logic switching circuit LC, which signal is low (i.e. $S_2=\overline{S_1}$) to activate the third mode (only when $S_1=1$).

The differential switching circuit comprises two transistors $T_{41}$ and $T_{42}$, whose emitters are coupled to each other and connected to the collector of the transistor $T_{40}$. A reference voltage $V'_{REF}$ is applied to the base of the transistor $T_{41}$, which has its collector connected to the output S. The signal $\overline{S_2}$, which is the logic inverse of $S_2$, is applied to the base of the transistor $T_{42}$, which has its collector connected to the supply voltage source Vcc. When $S_1=0$ the current source ($R_{40}$, $T_{40}$) is inoperative and, moreover, $S_2=0$ so that $T_{41}$ is cut off. When $S_1=1$ a current $I_4$ flows in the current source ($T_{40}$, $R_{40}$). When $\overline{S_2}=0$ $T_{42}$ conducts and the current $I_4$ flows in this transistor. If $\overline{S_2}=1$ $T_{42}$ is cut off, $T_{41}$ conducts and the generator behaves as a current source drawing a current $I_4$. It is possible to choose $I_4=I_1$. At least one of the controllable current sources can be controlled digitally. This implies that it may be formed by a digital-to-analog converter comprising npn transistors and having a current output. This enables a plurality of nominal current levels to be obtained, for example for an adaptive system (rapid switching between the modes and slow variation of the nominal current levels).

Figure 2:
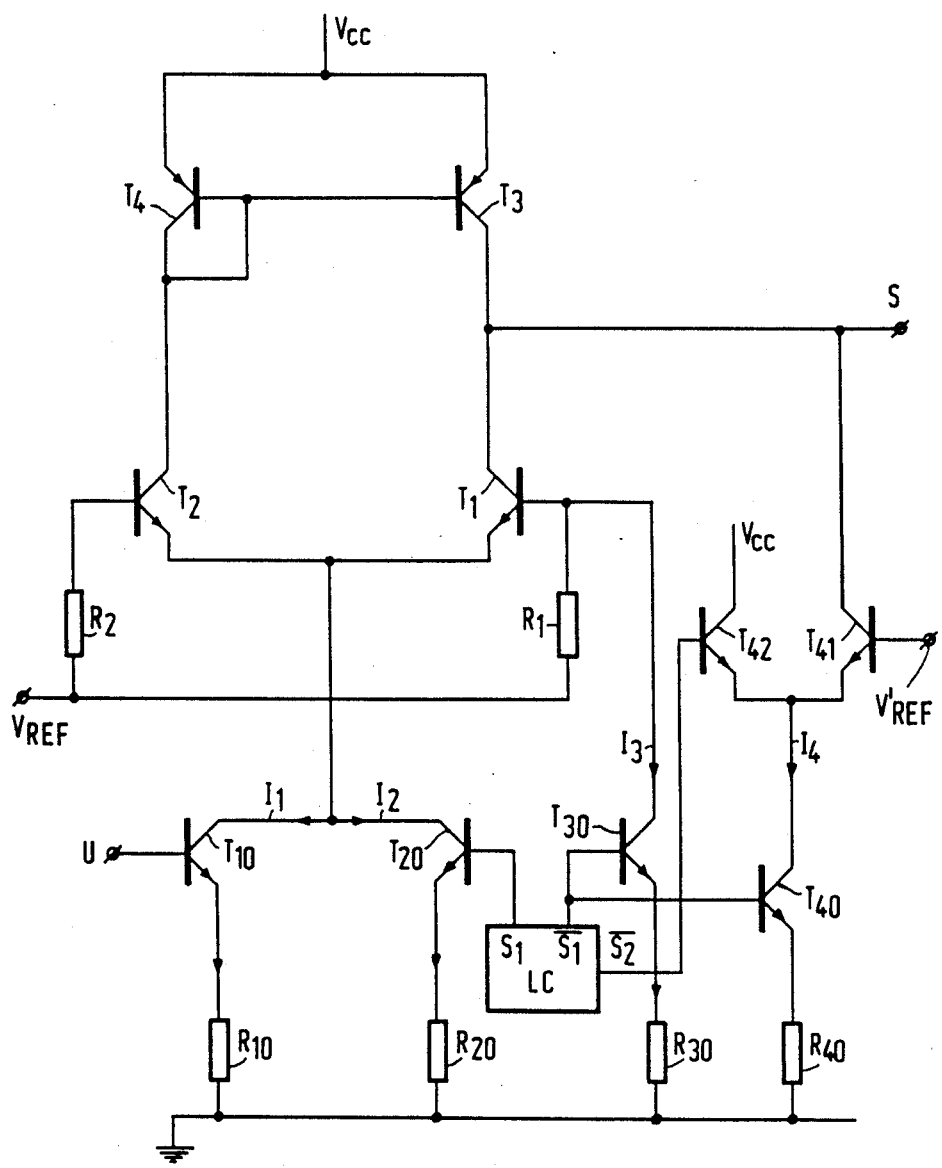

FIG. 2 differs from FIG. 1 in that the base of the transistor $T_{40}$ is connected to the output $\overline{S_1}$ of the logic switching circuit LC, and $I_4$ is selected to be substantially equal to $2I_1$ if the current supplied and the current absorbed should be equal. In the high-impedance mode ($S_1=1$, $\overline{S_1}=0$) the current source ($R_{40}$, $T_{40}$) is inoperative. In the other mode corresponding to $S_1=0$ $\overline{S_1}=1$) the signal $S_2$ controls either a current-sourcing state ($S_2=0$), in which S supplies the current $I_1$, or a current-sinking state ($S_2=1$), in which S absorbs current $I_4-I_1 \approx I_1$.

The invention, in particular the three-mode modification, applies in particular to a level-clamping system which employs charging and discharging (preferably with a current of the same absolute value), or the steady state, of a capacitive element, in particular for a TV tuner ("clamp" circuit).

It is to be noted that for obtaining the currents $I_1$ and $I_4$ of different values (FIG. 1) or the currents $I_3$ and $I_4$ of different values (FIG. 2) with equal base voltages of the corresponding transistors it is merely required to dimension these transistors differently ($T_{20}$ and $T_{40}$ for FIG. 1, $T_{30}$ and $T_{40}$ for FIG. 2).

The invention is not limited to the embodiments described or shown herein. For example, several controllable current sources may be connected to the collector of the transistor $T_1$, for example in order to realize a multi-level current generator (positive, negative or zero levels), or for the same purpose the controllable current source connected to the collector of the transistor $T_1$ may have a plurality of current levels (LC being capable of applying several voltage levels to the base of $T_{40}$).

We claim:

1. An integrated circuit comprising a switchable current generator having at least a first or current-supply mode and a second or high-impedance mode, characterized in that it comprises a first stage comprising a current mirror having a first and a second branch, and a second stage comprising a differential pair comprising a first ($T_1$) and a second ($T_2$) transistor of the npn type whose emitters are connected to each other and to a first current source ($R_{10}$, $T_{10}$) supplying a current of given magnitude, and whose collectors are connected respectively to said first and said second branch of the current mirror, the collector of the first transistor ($T_1$) forming an output of the switchable current generator, a controllable second current source ($R_{20}$, $T_{20}$) comprising a third transistor of the npn type connected to the emitters of the first ($T_1$) and the second ($T_2$) transistor, said second current source having a current-supply state and an inoperative state, a switching circuit (LC) constructed in such a manner that in the first mode the second current source is set to the inoperative state and the second stage is unbalanced so as to render the first transistor substantially non-conductive, and in the second mode the second current source is set to the current supply state and the second stage is balanced, and in that the currents of the first and the second current source are substantially equal.

2. A circuit as claimed in claim 1, characterized in that bases of the first and the second transistor are connected to a reference voltage ($V_{REF}$) source via a first ($R_1$) a second resistor ($R_2$) respectively, said circuit further comprising a controllable third current source connected to the base of the first transistor ($T_1$) and having a current supply state and an inoperative state, and in that the switching circuit (LC) comprises a means for controlling the third current source so as to set it to its current supply state in the first mode and to its inoperative state in the second mode.

3. A circuit as claimed in claim 2, characterized in that, in order to obtain a third mode, the circuit comprises a controllable npn-type fourth current source ($R_{40}$, $T_{40}$) connected to the collector of the first transistor ($T_1$) and having a current supply state and an inoperative state.

4. A circuit as claimed in claim 3, characterized in that the switching circuit is adapted in such a manner that in the third mode the second ($R_{20}$, $T_{20}$) and the fourth ($R_{40}$, $T_{40}$) current source are in the current supply state and the second stage is balanced.

5. A circuit as claimed in claim 4, characterized in that the current of the fourth current source ($R_{40}$, $T_{40}$) is substantially equal to that of the first current source ($R_{10}$, $T_{10}$).

6. A circuit as claimed in claim 3, characterized in that the switching circuit is adapted in such a manner that in the third mode the second current source is in the inoperative state, the second stage is unbalanced, and the fourth current source ($R_{40}$, $T_{40}$) is in the current supply state.

7. A circuit as claimed in claim 6, characterized in that the current of the fourth current source ($R_{40}$, $T_{40}$) is substantially equal to twice the current of the first current source ($R_{10}$, $T_{10}$).

8. A circuit as claimed in claim 1 wherein at least one controllable current source is a digital-to-analog converter having a current output.

9. A circuit as claimed in claim 1, characterized in that, in order to obtain a third mode, the circuit comprises a controllable npn-type further current source ($R_{40}$, $T_{40}$) connected to the collector of the first transistor ($T_1$) and having a current supply state and an inoperative state.

10. A circuit as claimed in claim 9, characterized in that the switching circuit is adapted in such a manner that in the third mode the second ($R_{20}$, $T_{20}$) and the further ($R_{40}$, $T_{40}$) current source are in the current supply state and the second stage is balanced.

11. A circuit as claimed in claim 10, characterized in that the current of the further current source ($R_{40}$, $T_{40}$) is substantially equal to that of the first current source ($R_{10}$, $T_{10}$).

12. A circuit as claimed in claim 9, characterized in that the switching circuit is adapted in such a manner that in the third mode the second current source is in the inoperative state, the second stage is unbalanced, and the further current source ($R_{40}$, $T_{40}$) is in the current supply state.

13. A circuit as claimed in claim 12, wherein the current of the further current source ($R_{40}$, $T_{40}$) is substantially equal to twice the current of the first current source.

* * * * *

UNITED STATES PATENT AND TRADEMARK OFFICE
CERTIFICATE OF CORRECTION

PATENT NO. : 4,970,452
DATED : November 13, 1990
INVENTOR(S) : STEPHANE BARBU ET AL It is certified that error appears in the above-identified patent and that said Letters Patent is hereby corrected as shown below:

Column 1, line 35, after "of" insert --a--;
         line 39, change ', in that it" to --. The novel circuit further--;
         line 41, delete "the" (second occurrence);
         line 44, change ", in that it comprises a" to --. A--;
         after "circuit" insert --is provided which is--;
         line 50, delete "in that";
         line 51, after "of" insert --the--;
         line 55, change ", the" to --. The--;
         line 57, change "abling" to --ables--;
Column 2, line 1, delete "suitably";
         line 18, delete "such";
         after "manner" insert --such--;
Column 3, line 24, change "remain" to --still be--;
         line 28, delete the comma "," (last occurrence);

Claim 1, column 4, line 56, delete "($T_1$)" and "($T_2$)";
         line 58, delete "($R_{10}$, $T_{10}$)";
         line 61, delete "($T_1$)";
         line 63, delete "($R_{20}$, $T_{20}$)";
         line 65, delete "the" (first occurrence) and delete "($T_1$)" and "($T_2$)";
         line 67, delete "(LC)";
         line 68, change "constructed in such a manner" to --which controls the second current source such--;
         column 5, line 6, delete "the" (first occurrence).

UNITED STATES PATENT AND TRADEMARK OFFICE
CERTIFICATE OF CORRECTION

PATENT NO. : 4,970,452

DATED : November 13, 1990

INVENTOR(S) : STEPHANE BARBU ET AL

It is certified that error appears in the above-identified patent and that said Letters Patent is hereby corrected as shown below:

```
Claim 2, column 5, line 10, delete "(V_REF)";
                   line 11, delete "(R_1)" and insert --and--;
                            after "resistor" insert a comma;
                            delete "(R_2)";
                   line 13, delete "(T_1^2)";
                   line 15, delete "(LC)"; delete "a";
Claim 3, column 5, line 22, delete "(R_40, T_40)";
                   line 23, delete "(T_1)";
Claim 4, column 5, line 26, change "is adapted in such a manner"
                            to --also controls the fourth current
                            source such--;
                   line 27, delete "(R_20, T_20)";
                   line 28, delete "(R_40, T_40)";
Claim 5, column 5, line 31, delete "(R_40, T_40)";
                   line 33, delete "(R_10, T_10)";
Claim 6, column 5, line 35, change "is adapted in such a manner"
                            to --also controls the fourth current
                            source such--;
         column 6, line  2, delete "(R_40, T_40)";
Claim 7, column 6, line  5, delete "(R_40, T_40)";
                   line  7, delete "(R_10, T_10)";
Claim 8, column 6, line  8, change "1" to --2--;
                   line  9, change "is" to --comprises--;
Claim 9, column 6, line 14, delete "(R_40, T_40)";
                   line 15, delete "(T_1)";
```

UNITED STATES PATENT AND TRADEMARK OFFICE
CERTIFICATE OF CORRECTION

PATENT NO. : 4,970,452

DATED : November 13, 1990

INVENTOR(S) : STEPHANE BARBU ET AL

It is certified that error appears in the above-identified patent and that said Letters Patent is hereby corrected as shown below:

```
Claim 10, column 6, line 18, change "is adapted in such a manner"
                              to --also controls the further current
                              source such--;
                    line 19, delete "(R_20, T_20)";
                    line 20, delete "(R_40, T_40)";
Claim 11, column 6, line 23, delete "(R_40, T_40)";
                    line 25, delete "(R_10, T_10)";
Claim 12, column 6, line 27, change "is adapted in such a manner"
                              to --also controls the further current
                              source such--;
                    line 30, delete "(R_40, T_40)";
Claim 13, column 6, line 33, delete "(R_40, T_40)";
Column 6, line 36, insert:
```

14. A circuit as claimed in Claim 1 wherein the controllable second current source comprises a digital-to-analog converter having a current output.

Signed and Sealed this

Seventeenth Day of March, 1992

Attest:

HARRY F. MANBECK, JR.

*Attesting Officer*   *Commissioner of Patents and Trademarks*